(12) United States Patent
Taniguchi

(10) Patent No.: US 11,606,844 B2
(45) Date of Patent: Mar. 14, 2023

(54) OPTICAL HEATING DEVICE

(71) Applicant: Ushio Denki Kabushiki Kaisha, Tokyo (JP)

(72) Inventor: Shinji Taniguchi, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/703,761

(22) Filed: Mar. 24, 2022

(65) Prior Publication Data

US 2022/0386417 A1 Dec. 1, 2022

(30) Foreign Application Priority Data

Jun. 1, 2021 (JP) .............................. JP2021-092069

(51) Int. Cl.
| | |
|---|---|
| *H05B 1/02* | (2006.01) |
| *H05B 3/00* | (2006.01) |
| *H01L 21/67* | (2006.01) |
| *H05B 47/14* | (2020.01) |

(52) U.S. Cl.
CPC ......... *H05B 1/0233* (2013.01); *H05B 3/0047* (2013.01); *H05B 47/14* (2020.01); *H01L 21/67115* (2013.01)

(58) Field of Classification Search
None
See application file for complete search history.

(56) References Cited

U.S. PATENT DOCUMENTS

| | | | |
|---|---|---|---|
| 10,072,986 B1* | 9/2018 | Howells ............ | H01L 21/67248 |
| 2010/0054720 A1* | 3/2010 | Hunter .............. | H01L 21/67248 |
| | | | 392/416 |
| 2020/0013645 A1* | 1/2020 | Gouda ............... | G01R 31/2879 |

FOREIGN PATENT DOCUMENTS

JP 2020-9927 A 1/2020

* cited by examiner

*Primary Examiner* — Dedei K Hammond
(74) *Attorney, Agent, or Firm* — Kenichiro Yoshida

(57) ABSTRACT

An optical heating device includes: a chamber that accommodates a workpiece; a supporter that supports the workpiece in the chamber; a plurality of solid-state light sources emitting heating light toward a main surface of the workpiece; a plurality of reference light sources that emit reference light toward the main surface of the workpiece when power of the same power value is supplied to each of the reference light sources; a plurality of photodetectors that corresponds to the respective reference light sources, and that output signals in response to the intensity of the reference light that has been received; and a controller that executes a reference mode and a heating mode, the reference light sources and the corresponding photodetectors are arranged to face each other through the workpiece, and the photodetectors are configured to receive the reference light emitted from the reference light sources and transmitted through the workpiece.

12 Claims, 4 Drawing Sheets

OPTICAL HEATING DEVICE

TECHNICAL FIELD

The present invention relates to an optical heating device.

BACKGROUND ART

Semiconductor manufacturing process involves various heat treatments including film forming treatment, oxidation diffusion treatment, modification treatment, and annealing treatment on workpieces, such as semiconductor wafers. These treatments often use a heat treatment method with optical irradiation that enables a non-contact treatment.

As a system for performing the heat treatment of workpieces, a system provided with lamps such as halogen lamps and solid-state light sources such as LEDs is known to irradiate workpieces with light for heating (hereinafter referred to as "heating light"). Patent document 1, for example, discloses a wafer heating unit in which a plurality of LEDs are mounted.

Patent Document 1: JP-A-2020-009927

SUMMARY OF THE INVENTION

In recent years, semiconductor manufacturing processes have been actively studied for further miniaturization, and processes on the order of several nm are becoming the mainstream. And the semiconductor manufacturing process has many issues that arise with miniaturization, and methods and equipment to solve these issues are being studied on a daily basis.

One of the issues that arises in the miniaturization of semiconductor manufacturing processes is the issue of heat treatment temperature. Conventionally, heat treatment processes such as annealing in semiconductor manufacturing processes have generally been performed at temperatures ranging from 500° C. to 1000° C. (or more than 1000° C. depending on the process).

However, in the semiconductor manufacturing process of several nm order, when heat treatment is performed in the above temperature range in the same way as in the conventional process, the heat causes damages on the narrow wiring and tiny elements formed on the semiconductor wafer, which deteriorate to an unacceptable degree. Hence, the semiconductor manufacturing process, as miniaturization progresses, increasingly needs heat treatment at lower temperatures (500° C. or lower) compared with that of the conventional processes.

In addition, the quality of films formed on the semiconductor wafer is often affected by the temperature during the heat treatment in the semiconductor manufacturing process. For this reason, the heating treatment in the semiconductor manufacturing process is necessary that the entire semiconductor wafer is heated without temperature unevenness.

Then, the present inventor has been keenly examining an optical heating device that is capable of performing the heat treatment of workpieces including semiconductor wafers at a lower temperature than conventional devices without temperature unevenness, the following issues were found to exist. It will be explained below with reference to the drawings.

The semiconductor manufacturing process is known to use a thermometer to monitor the temperature distribution of semiconductor wafers as a method of heating and treating semiconductor wafers without temperature unevenness. A specific method includes, for example, acquiring the temperature data of the semiconductor wafer during the heat treatment using a radiation thermometer, etc., which can measure the temperature in a non-contact manner by detecting the infrared light emitted from the object, and adjusting the intensity of the light irradiated to the semiconductor wafer according to the temperature data.

The radiant energy of light emitted from an object is known to shift its wavelength peak to the shorter wavelength side as the temperature of the object rises. Hence, radiation thermometers commercially available are generally set to have a longer detection wavelength range of infrared light when the detection temperature range becomes lower. As an example, a radiation thermometer with a detection temperature range of 500° C. to 2000° C. is set to have a detection wavelength range of 0.7 µm to 1.0 µm, and a radiation thermometer with a detection temperature range of 100° C. to 1000° C. is set to have a detection wavelength range of 1.5 µm to 4.0 µm. When expected to be used in a temperature range of 500° C. or lower, a radiation thermometer set to have a detection wavelength range of 1.5 µm to 4.0 µm of infrared light is generally employed.

However, the radiation thermometer in that detection wavelength range has difficulty in accurately monitoring the temperature variation of semiconductor wafers (especially silicon wafers) during the heat treatment. Hereinafter, the reasons for this will be explained when the workpiece are a silicon wafer.

FIG. 8 shows a graph indicating the relationship between the wavelength of infrared light and emissivity of silicon (Si) at respective temperatures. As shown in FIG. 8, Silicon (Si), which exhibits a unique emissivity characteristic, has a noticeably different shape of the wavelength-emissivity characteristic curve in the region of wavelengths longer than 1.5 µm compared to that of the wavelengths shorter than 1.5 µm, thus the variation of emissivity with respect to the variation of temperature becomes significantly large.

For this reason, a radiation thermometer with a detection wavelength range of 1.5 µm to 4.0 µm gradually fails to measure the temperature of silicon wafers accurately because the emissivity of silicon wafers fluctuates as the temperature rises due to the heat treatment.

In this case, a method of appropriately setting the emissivity on the radiation thermometer in accordance with the temperature rise may often be applied. However, the method involves the need for using another thermometer (e.g., thermocouple, etc.) that is capable of obtaining the temperature of the silicon wafer more accurately than a radiation thermometer, so as to confirm the reference temperature, which is impractical.

The present invention is made in consideration of the above issues, and it is an object of the present invention to provide an optical heating device that is capable of performing the heat treatment of a workpiece while controlling to suppress the temperature unevenness on the workpiece without using a thermometer.

An optical heating device includes:

a chamber that accommodates a workpiece as a heat treatment target;

a supporter that supports the workpiece in the chamber;

a plurality of solid-state light sources emitting heating light having a main emission wavelength in a range of 300 nm to 1050 nm toward a main surface of the workpiece supported by the supporter;

a plurality of reference light sources that are arranged on a plane parallel to the main surface of the workpiece, and that emit reference light having a main emission wavelength in a range of 1.2 µm to 6.0 µm toward the main surface of the workpiece when power of the same power value is supplied to each of the reference light sources;

a plurality of photodetectors that are arranged on a plane parallel to the main surface of the workpiece to correspond to the respective reference light sources, and that output signals in response to the intensity of the reference light that has been received; and a controller that executes a reference mode in which a plurality of values of the intensity of the reference light obtained by the signals output from the photodetectors are compared in order to determine power values of power that is to be supplied to each of the solid-state light sources, and a heating mode in which the power of the power values determined in the reference mode is supplied to each of the solid-state light sources, the reference light sources and the corresponding photodetectors are arranged such that a light-emitting surface of the reference light sources and a light-receiving surface of the photodetectors face each other through the workpiece; and the photodetectors are configured to receive the reference light emitted from the reference light sources and transmitted through the workpiece.

An optical heating device includes:

a chamber that accommodates a workpiece as a heat treatment target;

a supporter that supports the workpiece in the chamber;

a plurality of solid-state light sources emitting heating light having a main emission wavelength in a range of 300 nm to 1050 nm toward a main surface of the workpiece supported by the supporter;

a plurality of reference light sources that are arranged on a plane parallel to the main surface of the workpiece, and that emit reference light having a main emission wavelength in a range of 1.2 µm to 6.0 µm toward the main surface of the workpiece when power of the same power value is supplied to each of the reference light sources;

a plurality of photodetectors that are arranged on a plane parallel to the main surface of the workpiece to correspond to the respective reference light sources, and that output signals in response to the intensity of the reference light that has been received; and a controller that executes a reference mode in which a plurality of values of the intensity of the reference light obtained by the signals output from the photodetectors are compared in order to determine power values of power that is to be supplied to each of the solid-state light sources, and a heating mode in which the power of the power values determined in the reference mode is supplied to each of the solid-state light sources, the photodetectors are configured to receive the reference light that is emitted from the corresponding reference light sources and that is reflected on the main surface of the workpiece, and each of the reference light sources and the corresponding photodetectors is configured to allow a first optical path length of a main beam of the reference light to be substantially the same, the first optical path length being an optical path length of the reference light being output from each of the reference light sources and incident on the workpiece; and is configured to allow a second optical path length of the main beam of the reference light to be substantially the same, the second optical path length being an optical path length of the reference light being reflected on the main surface of the workpiece and incident on each of the photodetectors.

The term "reference light" in the present specification is referred to as light emitted from a light source, transmitted through the workpiece or reflected on the main surface of the workpiece, and then received by a photodetector; the reference light is referred to as light primarily used for referring to temperature variation in the workpiece, rather than heating the workpiece.

The "main emission wavelength" in the present specification refers to a peak wavelength at which the light intensity is highest in the spectrum.

The term "power of the same power value" in the present specification is not limited only to the case in which the power value is completely identical, thus allows for errors caused by the circuit configuration and the degree of error that may occur in control. The "power value" corresponds to the current value or voltage value in accordance with the light source, and "supplying power" corresponds to supplying current and applying voltage in accordance with the light source.

The term "parallel" in the present specification is not limited to the case of perfect parallelism, but allows for a slight tilt in the degree of error that may occur in the configuration of the device.

In the present specification, the term "light source and corresponding photodetector" or "corresponding light source and photodetector" refers to a light source that emits reference light and a photodetector that is arranged to receive mainly the reference light.

The light irradiated onto the workpiece satisfies the relationship of the following formula with respect to transmittance, reflectance and absorptance (=emissivity):

Reflectance+Absorptance(Emissivity)+Transmittance=1

Hence, the transmittance and reflectance of the workpiece fluctuate with the variation of emissivity. The emissivity of an object, for example one made of silicon, fluctuates even slightly on its temperature, which also depends on the wavelength range of interest.

According to this characteristic, the reference light incident on the workpiece with the same intensity and transmitted through the workpiece, or the reference light reflected on the main surface of the workpiece, is light having an intensity corresponding to the temperature at the position of the workpiece on which the reference light is incident.

In other words, when the brightness of each of the solid-state light sources is controlled to make the intensity of the light received by the photodetector to be aligned, the temperature distribution across the entire workpiece becomes more uniform, enabling the heat treatment of the workpiece without temperature unevenness.

However, if the main emission wavelength of the heating light is very close to that of the reference light, the heating light, similar to the reference light, is transmitted through the workpiece or reflected on the main surface of the workpiece. In this case, the photodetector receives the heating light, which has become stray light, along with the reference light emitted from the corresponding reference light source, thereby the intensity of the light received by the photodetector fluctuates with the received heating light in addition to the temperature of the workpiece. In short, the controller fails to accurately obtain information on the temperature of the workpiece, thereby making it impossible to properly control the brightness of the solid-state light sources.

Hence, the main emission wavelengths of the heating light and reference light is preferably configured to be included in different wavelength ranges. Specifically, the main emission wavelength of the heating light is preferably selected to be within a wavelength range in which the absorption rate (emissivity) of the workpiece is relatively high. The main emission wavelength of the reference light is preferably selected to be within a wavelength range in which the absorption rate (emissivity) of the workpiece is relatively low.

In particular, when the workpiece is a silicon wafer, the main emission wavelength of the reference light is preferably within a wavelength range of 1.2 μm to 6.0 μm, in which the emissivity is significantly temperature dependent, more preferably within a wavelength range of 1.5 μm to 4.0 μm Then, the main emission wavelength of the heating light emitted from the solid-state light sources is in a range different from the above wavelength range that includes the main emission wavelength of the reference light, is preferably within a wavelength range of 300 nm to 1050 nm, in which the absorption rate (emissivity) of silicon to the light is high, and more preferably within a wavelength range of 350 nm to 1,000 nm.

As described above, the above configuration enables the optical heating device to monitor the temperature variation of the entire workpiece without using a thermometer, and to perform heat treatment while suppressing temperature unevenness of the entire workpiece. In addition, since the wavelength bands containing the main emission wavelengths of the heating light and the reference light are set in different ranges, the respective lights do not interfere with each other, referring to the temperature variation of the workpiece accurately, thereby performing the heat treatment of the workpiece uniformly.

The actual temperature of the workpiece is controlled to be within an acceptable error range based on a temperature that is assumed to converge (hereinafter referred to as the "approximate temperature") when a plurality of solid-state light sources (heating light sources) are lit at the desired brightness and the heat treatment is performed with the desired lighting pattern.

In the above optical heating device, the controller may be configured to turn off a plurality of the solid-state light sources when switched to the reference mode.

The above configuration reduces the amount of heating light received by the photodetector and enables the controller to more accurately refer to the temperature variation of the workpiece, thereby performing the heat treatment more uniformly on the entire workpiece.

In the above optical heating device, each of the reference light sources may be arranged to have a separation distance to the corresponding photodetector longer than that of the other reference light sources to the corresponding photodetector.

The above configuration suppresses the amount of reference light emitted from a different reference light source than the corresponding reference light source from being received by the photodetector. Therefore, the controller is able to refer to the temperature variation of the workpiece more accurately, and perform the heat treatment of the workpiece while further suppressing the temperature unevenness.

An optical heating device according to the present invention includes:

a chamber that accommodates a workpiece as a heat treatment target;

a supporter that supports the workpiece in the chamber;

a plurality of heating light sources emitting heating light including infrared light having a wavelength in a range of 1.2 μm to 6.0 μm toward a main surface of the workpiece supported by the supporter;

a plurality of photodetectors that are arranged to correspond to one of the heating light sources, and that output signals in response to the intensity of the infrared light that has been received; and a controller that executes a reference mode in which a plurality of values of the intensity of the heating light obtained by the signals output from the photodetectors are compared in order to determine power values of power that is to be supplied to each of the heating light sources, and a heating mode in which the power of the power values determined in the reference mode is supplied to each of the heating light sources, the heating light sources and the corresponding photodetectors are arranged such that a light-emitting surface of the heating light sources and a light-receiving surface of the photodetectors face each other through the workpiece;

the photodetectors are configured to receive the heating light emitted from the corresponding heating light source and transmitted through the workpiece; and the controller supplies power of the same power value to at least the heating light sources that correspond to the photodetectors when switched to the reference mode.

With the above configuration, the optical heating device is able to utilize the heating light source as the reference light source. Hence, the optical heating device reduces the number of components constituting the device, allows the overall size of the device to be made smaller, and suppresses manufacturing costs.

The term "including infrared light" here refers to the inclusion of infrared light having a light intensity with which the infrared light penetrates at least the workpiece and is detectable with a photodetector.

In the above optical heating device, the controller may be configured to supply power of the same power value to a plurality of the heating light sources when switched to the reference mode.

In the above optical heating device, the controller may be configured to supply power of the same power value to the heating light sources that correspond to the photodetectors, and stop supplying power to the other heating light sources when switched to the reference mode.

The above configuration allows each of the photodetectors to receive light emitted from the heating light source to which power of the same power value is supplied in the reference mode. Hence, this configuration suppresses errors that are contained in the signals output from a plurality of the photodetectors, and that is associated with differences in the brightness of the respective heating light sources. Therefore, the controller is able to refer to the temperature variation of the workpiece more accurately, performing the heat treatment of the entire workpiece more uniformly.

In addition, in the reference mode, the controller stops supplying power to the heating light source that does not correspond to the photodetector, thereby preventing the photodetector from receiving light emitted from the heating light source that does not correspond to the photodetector. Therefore, the controller is able to refer to the temperature variation of the workpiece more accurately, performing the heat treatment of the entire workpiece more uniformly.

In the above optical heating device, the heating light sources may be solid-state light sources.

The above configuration allows the controller to control the lighting and turning off of the heating light source at high speed and to adjust the brightness more precisely. Therefore, in the optical heating device, this configuration prevents the temperature of the workpiece from dropping significantly during the switching between the lighting and turning off, enabling more precise temperature control.

The present invention provides an optical heating device that is capable of performing the heat treatment of a workpiece while controlling to suppress temperature unevenness in the workpiece without using a thermometer.

DETAILED DESCRIPTION OF THE EMBODIMENTS

Hereinafter, embodiments of an optical heating device according to the present invention will now be described with reference to the drawings. It is noted that each of the following drawings related to the optical heating device is merely schematically illustrated. The dimensional ratios and the number of parts on the drawings do not necessarily match the actual dimensional ratios and the actual number of parts.

First Embodiment

Figure 1:
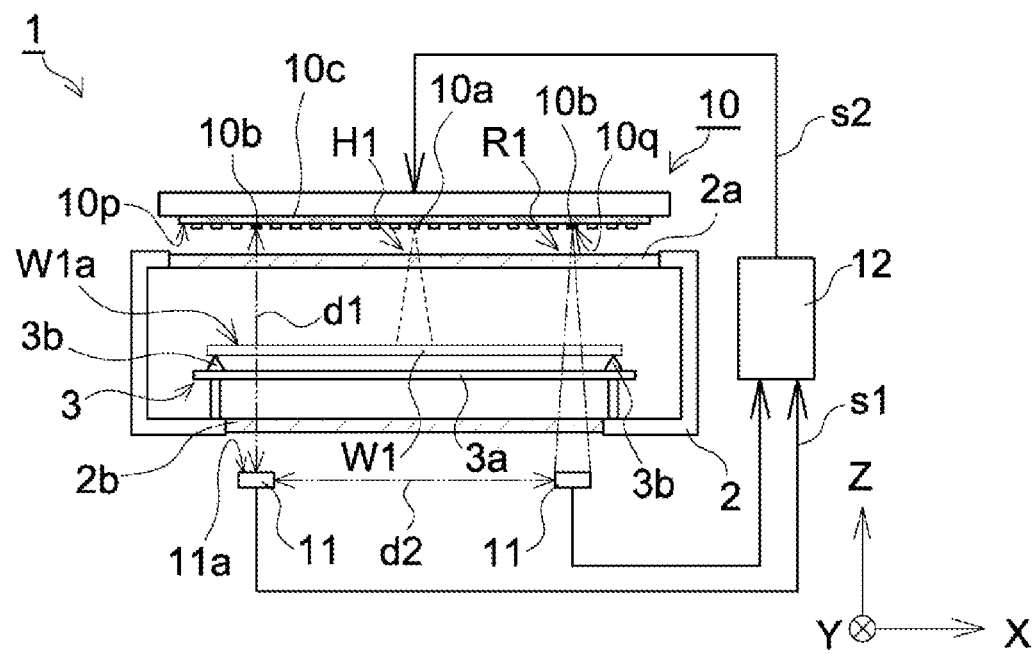
FIG. 1 is a schematic cross-sectional view illustrating an embodiment of an optical heating device when viewed in the Y direction.
Figure 2:
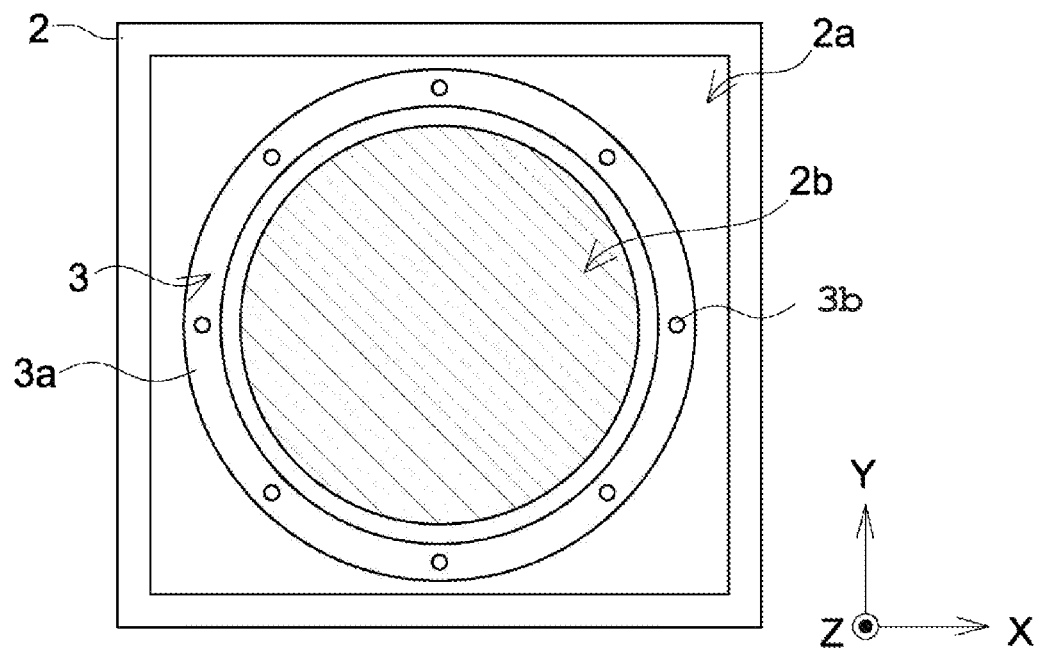
FIG. 2 is a drawing of a chamber in FIG. 1 when viewed from the +Z side.

FIG. 1 is a schematic cross-sectional view illustrating a first embodiment of an optical heating device 1 when viewed in the Y direction. FIG. 2 is a drawing of a chamber 2 in FIG. 1 when viewed from the +Z side. As shown in FIG. 1, the optical heating device 1 is provided with the chamber 2, a light source unit 10, a plurality of photodetectors 11, and a controller 12. In FIG. 2, the light-transmissive window 2a, which will be described later, is not shaded to allow the structure inside the chamber 2 to be seen.

In the following description, a plane parallel to the main surface W1a of a workpiece W1, which is a heat treatment target and is accommodated in the chamber 2, is defined as the XY plane as shown in FIG. 2; a direction perpendicular to the XY plane is defined as the Z direction as shown in FIG. 1.

when the direction is expressed, a positive or negative sign is assigned to distinguish a positive direction from a negative direction, such as "+Z direction" and "−Z direction". In the case of expressing the direction without distinguishing a positive direction from a negative direction, it is simply expressed as "Z direction".

In the description of the first embodiment, the workpiece W1 is assumed to be a silicon wafer, but the optical heating device 1 is also assumed to be used for the heat treatment of the workpieces W1 other than silicon wafers (e.g., glass substrates, etc.).

As shown in FIG. 1, the chamber 2 is provided with a supporter 3 for placing the workpiece W1 inside the chamber 2, a light-transmissive window 2a for guiding light emitted from a light source unit 10 to the inside of the chamber 2, and a light-transmissive window 2b for guiding light emitted from the light source unit 10 and transmitted through the workpiece W1 (reference light R1 to be described later) to the outside of the chamber 2.

As shown in FIGS. 1 and 2, the supporter 3 is structured to have a plurality of protrusions 3b on a base 3a, and the workpiece W1 is placed on and supported by the tips of the protrusions 3b. The base 3a of the supporter 3 has a circular shape, as shown in FIG. 2, and is configured to prevent light transmitted through the workpiece W1 (reference light R1 to be described later) from being blocked before reaching the light-transmissive window 2b, as shown in FIG. 1. The configuration of the supporter 3 shown in FIGS. 1 and 2 is merely an example; and may have a different shape or structure from the configuration.

As shown in FIG. 1, the light source unit 10 includes a plurality of solid-state light sources 10a that emit heating light H1, a plurality of reference light sources 10b that emit reference light R1, and a light source substrate 10c on which a plurality of the solid-state light sources 10a and a plurality of the reference light sources 10b are arranged.

The light source substrate 10c for the light source is placed to allow a mounting surface 10p, on which the solid-state light sources 10a and the reference light sources 10b are arranged, to be parallel to the XY plane. In other words, in the first embodiment, the solid-state light sources 10a and the reference light sources 10b are arranged on the same plane parallel to the XY plane to emit light toward the main surface W1a of the workpiece W1.

The solid-state light source 10a in the first embodiment is an LED with a main emission wavelength of 400 nm. The solid-state light source 10a may be an LED that emits light with a main emission wavelength different from 400 nm, or a solid-state light source other than an LED.

Figure 8:
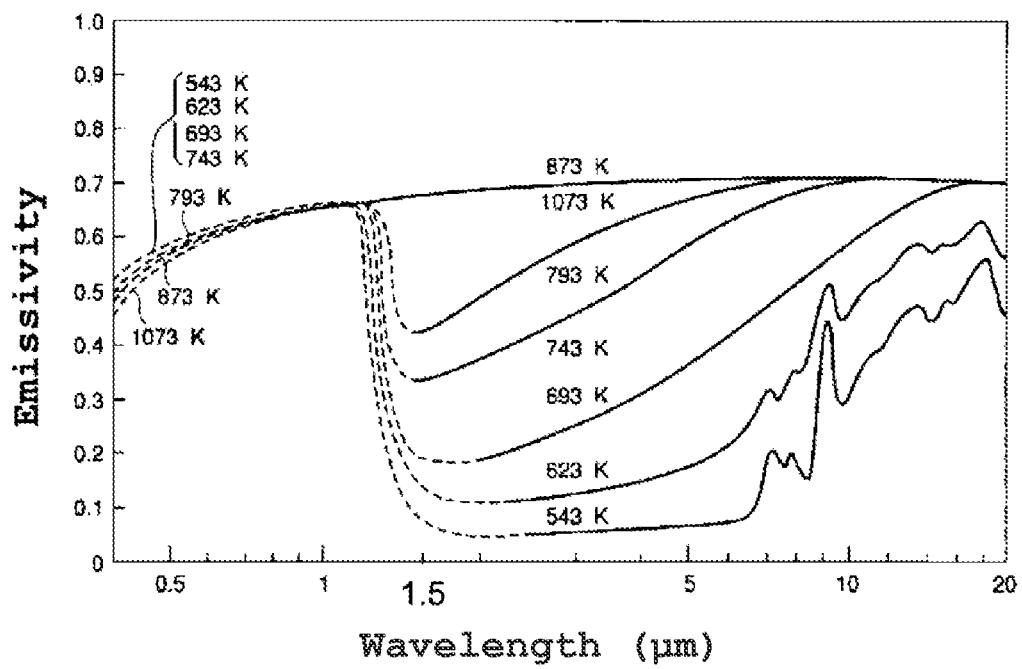
FIG. 8 is a graph illustrating a relationship between the wavelength of infrared light and the emissivity of silicon (Si) at various temperatures.

The main emission wavelength of the solid-state light source 10a is preferably within a wavelength range of 300 nm to 1050 nm, in which the absorptance is high as shown in FIG. 8, and is more preferably within the wavelength range of 350 nm to 1000 nm in order to perform efficiently the heat treatment of the silicon wafer, which is the workpiece W1 in the present embodiment.

The reference light source 10b in the first embodiment is an LED having a main emission wavelength of 1.5 μm. The reference light source 10b may be an LED that emits light having a wavelength different from the main emission wavelength of 1.5 μm or a solid-state light source other than an LED, including an LD.

Note that the main emission wavelength of the reference light source 10b is set in a wavelength range different from the range in which the main emission wavelength of the solid-state light source 10a is set as described above. In particular, when the workpiece W1 is a silicon wafer, the main emission wavelength of the reference light source 10b is preferably within a wavelength range of 1.2 μm to 6.0 μm, in which the emissivity (=1−transmittance−reflectance) fluctuates significantly with the variation of temperature as shown in FIG. 8, and is more preferably within a wavelength range of 1.5 μm to 4.0 μm.

As shown in FIG. 1, a plurality of the photodetectors 11 in the first embodiment are arranged to receive the reference light R1 transmitted through the workpiece W1 and emitted from the light-transmissive window 2b to the outside of the chamber 2.

The photodetector 11 is a component that outputs a signal s1 corresponding to the light intensity of the reference light R1 received by it. The photodetector 11 in the first embodiment is a photodiode; however, can be other than a photodiode, for example, a photovoltaic device or a linear image sensor.

The photodetectors 11 each correspond to one of a plurality of the reference light sources 10b, and are arranged in the XY plane such that a light-receiving surface 11a of the photodetectors 11 faces a light-emitting surface 10q of the corresponding reference light sources 10b in the Z direction.

The optical heating device 1 of the first embodiment is configured to have a separation distance d1 between the photodetectors 11 and the corresponding reference light sources 10b of 80 mm, and a separation distance d2 between the photodetector 11 and the adjacent photodetector 11 of 100 mm, as shown in FIG. 1. In other words, the separation distance d2, which is between the photodetector 11 and the adjacent photodetector 11, is configured to be larger than the separation distance d1, which is between photodetector 11 and the corresponding reference light source 10b. It is noted that when the reference light source 10b is a light source that emits reference light R1 with a sufficiently small divergence angle, such as LD, the respective separation distances (d1, d2) may be set to any lengths, regardless of the above.

Figure 3:
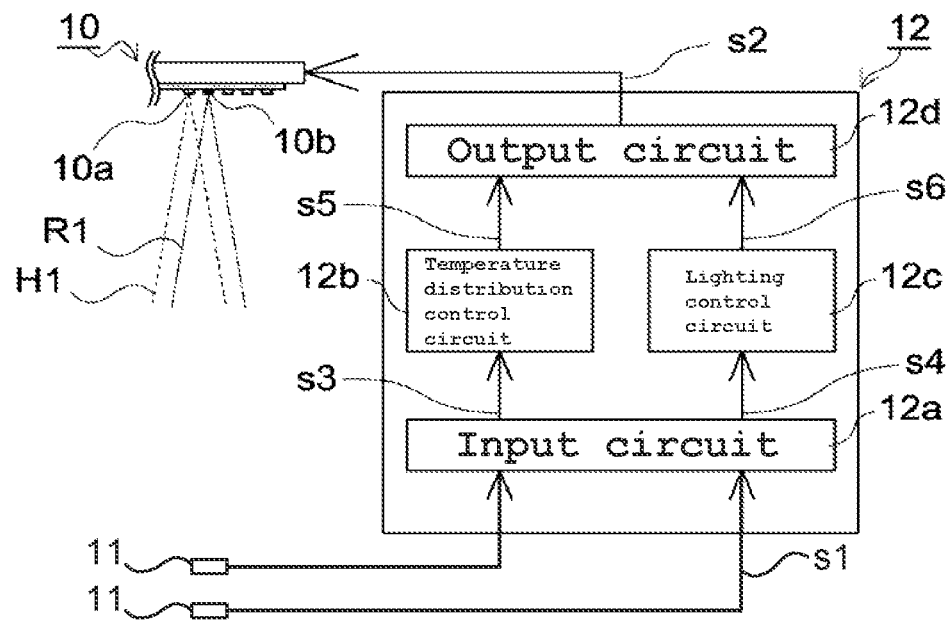
FIG. 3 is a block diagram of a controller in an embodiment.

FIG. 3 is a block diagram of the controller 12 in the first embodiment. As shown in FIG. 3, the controller 12 is provided with an input circuit 12a, a temperature distribution control circuit 12b, a lighting control circuit 12c, and an output circuit 12d.

The controller 12 is configured to execute a reference mode in which a plurality of values of the intensity of the reference light R1 obtained by the signals s1 output from a plurality of the photodetectors 11 are compared in order to determine a current s2 of current values that are to be supplied to each of the solid-state light sources 10a, and a heating mode in which the current s2 of the current values determined in the reference mode is supplied to each of the solid-state light sources. The controller 12 is, for example, a computing device such as an MPU or MCU, or an external device for computing such as a PC or tablet.

Figure 4:
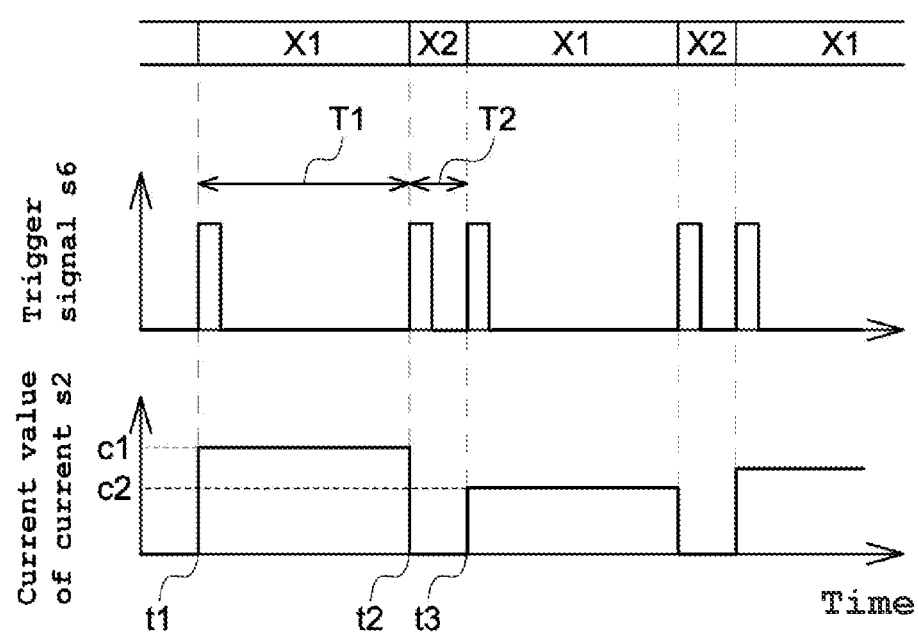
FIG. 4 is a timing chart illustrating a relationship among each of modes executed by the controller, a trigger signal and a current supplied to a solid-state light sources.

FIG. 4 is a timing chart illustrating a relationship among each of modes executed by the controller 12, a trigger signal s6, and the current s2 supplied to part of the solid-state light sources 10a. The mode chart in FIG. 4 shows a timing at which each mode is switched, the trigger signal graph in FIG. 4 shows the output of a trigger signal s6 output by the lighting control circuit 12c to be described later, and the current graph in FIG. 4 shows an example of the variation of the current s2 supplied by the controller 12 to the solid-state light sources 10a. Hereinafter, the operation of each block will be described with reference to FIG. 3, and then an example of the operation of each mode of the controller 12 will be explained with reference to FIGS. 3 and 4.

When receiving the signal s1 that has been output from a plurality of the photodetectors 11, the input circuit 12a generates light intensity data s3 based on the signal s1 so as to be able to be processed by the temperature distribution control circuit 12b, and outputs the light intensity data s3 to the temperature distribution control circuit 12b.

When outputting all of the light intensity data s3, which is to be a comparative target to the temperature distribution control circuit 12b, the input circuit 12a outputs a notification signal s4 to the lighting control circuit 12c to notify that the output of the light intensity data s3 to the temperature distribution control circuit 12b has been completed.

When receiving the light intensity data s3, which is to be a comparative target, from the input circuit 12a, the temperature distribution control circuit 12b calculates the current value of the current s2 to be supplied to a plurality of the solid-state light sources 10a shown in FIG. 1 based on the light intensity data s3. Upon completion of the calculation of the current value of the current s2, the temperature distribution control circuit 12b outputs a current value data s5 to the output circuit 12d.

The current value of the current s2 supplied to the solid-state light sources 10a may be calculated separately for each of the solid-state light sources 10a or may be determined by dividing the mounting surface 10p on which the solid-state light sources 10a are arranged on the light source substrate 10c into several areas and calculating the current value for the solid-state light sources 10a contained in each area.

When receiving the notification signal s4 that has been output by the input circuit 12a, the lighting control circuit 12c outputs a trigger signal s6 to the output circuit 12d, which allows the output circuit 12d to start outputting the current s2 after a predetermined time has elapsed. The lighting control circuit 12c of the first embodiment is provided with a timer, which is not shown and counts the time of switching between the heating mode and the reference mode.

When receiving the current value data s5 from the temperature distribution control circuit 12b, the output circuit 12d becomes in a state to supply the current s2 at a predetermined current value to each of the solid-state light sources 10a and waits for the trigger signal s6 to receive from the lighting control circuit 12c. When receiving the trigger signal s6 from the lighting control circuit 12c, the output circuit 12d starts supplying the current s2 to each of the solid-state light sources 10a at a preset current value.

The heating mode X1 starts when the lighting control circuit 12c outputs the trigger signal s6 to the output circuit 12d at a time t1, as shown in FIG. 4. When the heating mode X1 starts, the output circuit 12d supplies the current s2 to each of the solid-state light sources 10a at a predetermined current value c1.

The reference mode X2 starts when the lighting control circuit 12c outputs the trigger signal s6 to the output circuit 12d to stop supplying current s2 to the solid-state light sources 10a at a time t2, at which a predetermined time T1 elapses from the time t1 when the heating mode X1 starts. In the first embodiment, as shown in the trigger signal graph in FIG. 4, the trigger signal s6 acts to start the supply of current s2 and also acts to stop the supply of current s2. The output circuit 12d is configured to switch its operation whenever receiving the trigger signal s6.

When the reference mode X2 starts, the output circuit 12d stops supplying current s2 to the solid-state light sources 10a, thus making the light source unit 10 in a state in which the solid-state light sources 10a are turned off and only the reference light sources 10b are turned on. A plurality of the photodetectors 11 then output the signal s1 to the input circuit 12a based on the reference light R1 received in the state in which only the reference light sources 10b are lit.

As shown in FIG. 3, when a plurality of the signals s1 are input to the input circuit 12a, each block in the controller 12 executes the respective operation described above. When the current value c2 of the current s2, which is output by the output circuit 12d, is calculated and the setting of the current output of the output circuit 12d is completed, the output circuit 12d waits for the trigger signal s6 to be output from the lighting control circuit 12c. Then, when time T2 has elapsed from time t2, as shown in FIG. 4, the lighting control circuit 12c outputs the trigger signal s6 to the output circuit 12d, thereby the heating mode X1 starts.

The respective times (T1, T2) are adjusted accordingly depending on the speed of heating and other factors; however as an example, the times (T1, T2) in the first embodiment are set to as 1 second for the time T1 in the heating mode X1 and 0.1 second for the time T2 in the reference mode X2.

By repeating the heating mode X1 and the reference mode X2 as described above, the controller 12 adjusts the current value of the current s2 supplied to a plurality of the solid-state light sources 10a, and performs the heat treatment while suppressing the temperature unevenness of the workpiece W1.

The above configuration enables the optical heating device 1 to refer to the temperature variation of the entire workpiece W1 without using a thermometer, and to perform the heat treatment while suppressing the temperature unevenness of the entire workpiece W1. In addition, since the wavelength band containing the main emission wavelength of the heating light H1 is set in a range different from the wavelength band containing the main emission wavelength of the reference light R1, the respective lights do not interfere with each other as stray light, performing the heating treatment and referring to the temperature unevenness accurately.

The light source unit 10 of the first embodiment is configured to include the single light source substrate 10c on which a plurality of the solid-state light sources 10a and a plurality of the reference light sources 10b arranged; however the light source unit 10 may be configured to include the light source substrate 10c on which the solid-state light sources 10a is arranged and the light source substrate 10c on which the reference light sources 10b are arranged.

The controller 12 of the first embodiment is configured to stop supplying the current s2 to the solid-state light sources 10a in the reference mode X2; however, the controller 12 may be configured not to stop supplying the current s2 to the solid-state light sources 10a during the reference mode X2 in a case in which the spectrum of the heating light H1 and the reference light R1 are configured to be sufficiently apart from each other so that lighting the solid-state light sources 10a causes no problem for referring to the temperature variation.

In the first embodiment, the reference light sources 10b are lit in both the heating mode X1 and the reference mode X2. However, the controller 12 may be provided with a control circuit that switches between the lighting and turning off of the reference light source 10b, thus allowing the reference light source 10b to turn on only in the reference mode.

Second Embodiment

The configuration of the second embodiment of the optical heating device 1 of the present invention will be described, mainly focusing on the parts that differ from those of the first embodiment.

Figure 5:
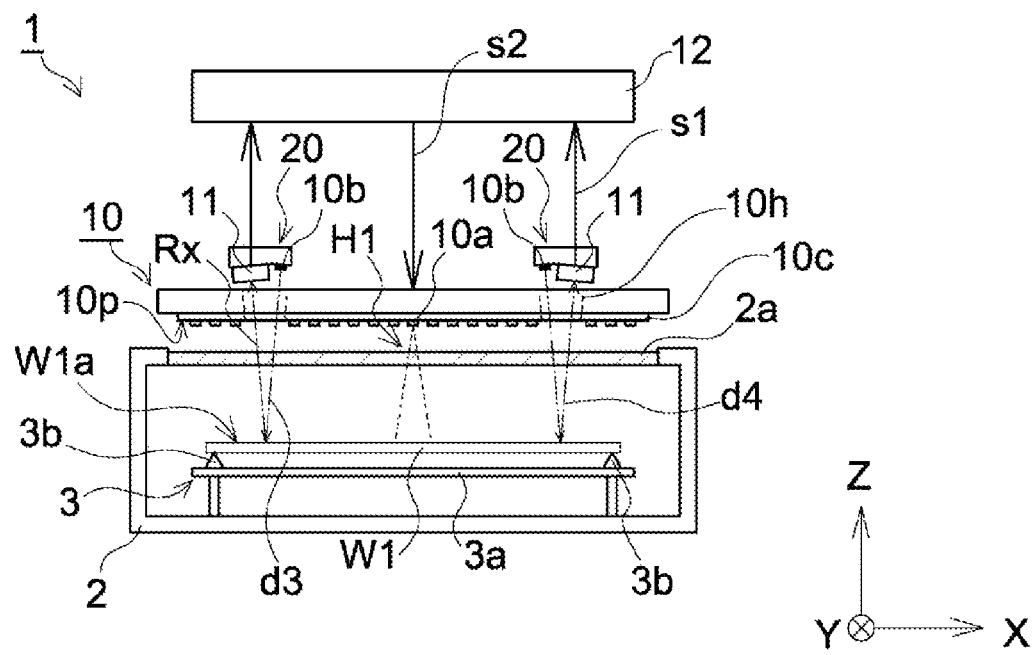
FIG. 5 is a schematic cross-sectional view illustrating another embodiment of an optical heating device when viewed in the Y direction.

FIG. 5 is a schematic cross-sectional view illustrating a second embodiment of the optical heating device 1 when viewed in the Y direction. As shown in FIG. 5, in the second embodiment of the optical heating device 1, only the solid-state light sources 10a are arranged on the light source substrate 10c of the light source unit 10. Then, a plurality of reference units 20 including the corresponding reference light sources 10b and the photodetectors 11 are provided on the +Z side with respect to the light source unit 10.

In the reference unit 20, the reference light sources 10b emit the reference light R1 (not shown) toward the workpiece W1 through a through hole 10h provided in the light source unit 10. The photodetectors 11 provided in the reference unit 20 receive the light that is reflected on the main surface W1a of the workpiece W1 and returns to the side of the reference unit 20 again through the through hole 10h of the light source unit 10.

When an optical path length d3 is defined as the optical path length of the main beam Rx of the reference light R1 being output from the reference light source 10b and incident on the workpiece W1, each of the reference units 20 is configured to have substantially the same optical path length d3, as shown in FIG. 5. In addition, when an optical path length d4 is defined as the optical path length of the main beam Rx of the reference light R1 being reflected at the main surface W1a of the workpiece W1 and incident to the photodetector 11, each of the reference units 20 is configured to have substantially the same optical path length d4.

The above configuration allows the optical heating device 1 to be downsized as a whole because the light source unit 10 and the photodetectors 11 can be arranged together on one side (in this case, the +Z side) of the chamber 2 in the Z direction. In addition, the optical heating device 1 of the second embodiment is configured such that the one reference unit 20 is composed of the reference light source 10b and the corresponding photodetector 11, thus making it easy to align the corresponding reference light source 10b with the photodetector 11 and so on.

The optical heating device 1 of the second embodiment is configured with the light source unit 10 and the reference unit 20. However, the light source unit 10 and the reference unit 20 may be configured as an integrated unit, or as in the first embodiment, the solid-state light sources 10a and the reference light sources 10b may be arranged in the light source unit 10, and only the photodetectors 11 may be separately disposed.

Third Embodiment

The configuration of the third embodiment of the optical heating device 1 of the present invention will be described, focusing on the parts that differ from those of the first and second embodiments.

Figure 6:
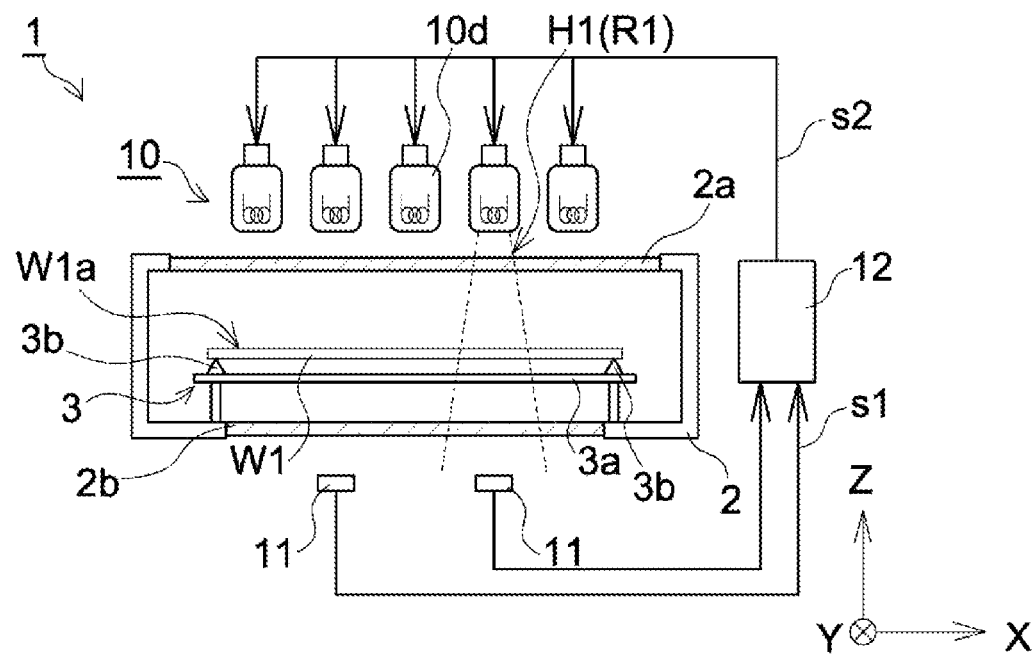
FIG. 6 is a schematic cross-sectional view illustrating yet another embodiment of an optical heating device when viewed in the Y direction.
Figure 7:
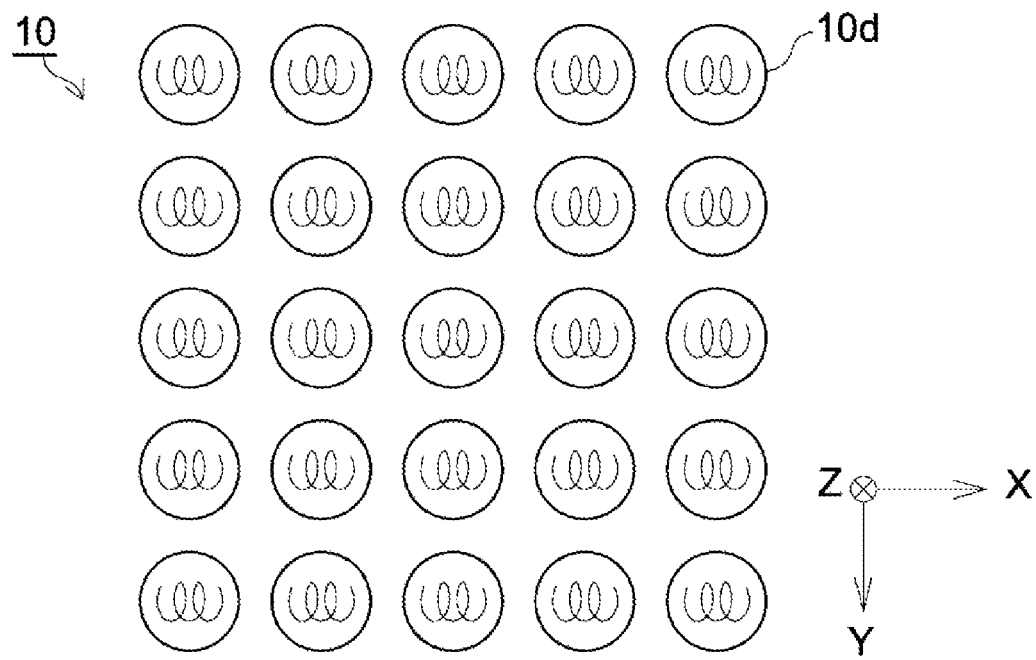
FIG. 7 is a drawing of a light source unit in FIG. 6 when viewed from the −Z side.

FIG. 6 is a schematic cross-sectional view illustrating a third embodiment of the optical heating device 1 when viewed in the Y direction. FIG. 7 is a drawing of the light source unit 10 in FIG. 6 when viewed from the −Z side. As shown in FIG. 7, in the third embodiment of the optical heating device 1, the light source unit 10 is configured with a plurality of lamp light sources 10d emitting the heating light H1 arranged in the XY plane.

The lamp light source 10d is a light source that emits the heating light H1 including infrared light having a wavelength of 1.2 µm to 6.0 µm, such as a xenon lamp. The lamp light source 10d may be a light source other than a lamp light source, as long as it is capable of emitting infrared light in the above wavelength range. For example, it can be a solid-state light source such as an LED or LD having its main emission wavelength in the relevant wavelength range.

Since the heating light H1 emitted from the lamp light source 10d in the third embodiment contains infrared light in the above wavelength range, it can be used as the reference light R1 in the first embodiment. In other words, the lamp light source 10d also serves the reference light source as well as the heating light source.

In the third embodiment, the controller 12 controls to supply (or apply) the same current s2 (or voltage) to a plurality of the lamp light sources 10d corresponding to the photodetector 11 when switched to the reference mode, and stops supplying (or applying) the current s2 (or voltage) to a plurality of the lamp light sources 10d not corresponding to the photodetector 11.

The controller 12 may be configured to supply (apply) the same current s2 (or voltage) to all lamp light sources 10d in the reference mode.

The above configuration eliminates the need for separately mounting the heating light source and the reference light source, enabling a simpler configuration of the optical heating device 1, thereby making it easier to perform maintenance work on the device and to identify the cause when a problem occurs and so on.

What is claimed is:

1. An optical heating device comprising:
   a chamber that accommodates a workpiece as a heat treatment target;
   a supporter that supports the workpiece in the chamber;
   a plurality of solid-state light sources emitting heating light having a main emission wavelength in a range of 300 nm to 1050 nm toward a main surface of the workpiece supported by the supporter;
   a plurality of reference light sources that are arranged on a plane parallel to the main surface of the workpiece, and that emit reference light having a main emission wavelength in a range of 1.2 μm to 6.0 μm toward the main surface of the workpiece when power of the same power value is supplied to each of the reference light sources;
   a plurality of photodetectors that are arranged on a plane parallel to the main surface of the workpiece to correspond to the respective reference light sources, and that output signals in response to the intensity of the reference light that has been received; and
   a controller that executes a reference mode in which a plurality of values of the intensity of the reference light obtained by the signals output from the photodetectors are compared in order to determine power values of power that is to be supplied to each of the solid-state light sources, and a heating mode in which the power of the power values determined in the reference mode is supplied to each of the solid-state light sources,
   wherein the reference light sources and the corresponding photodetectors are arranged such that a light-emitting surface of the reference light sources and a light-receiving surface of the photodetectors face each other through the workpiece; and
   the photodetectors are configured to receive the reference light emitted from the reference light sources and transmitted through the workpiece.

2. The optical heating device according to claim 1, wherein the controller is configured to turn off a plurality of the solid-state light sources when switched to the reference mode.

3. The optical heating device according to claim 1, wherein each of the reference light sources is arranged to have a separation distance to the corresponding photodetector longer than that of the other reference light sources to the corresponding photodetector.

4. An optical heating device comprising:
   a chamber that accommodates a workpiece as a heat treatment target;
   a supporter that supports the workpiece in the chamber;
   a plurality of solid-state light sources emitting heating light having a main emission wavelength in a range of 300 nm to 1050 nm toward a main surface of the workpiece supported by the supporter;
   a plurality of reference light sources that are arranged on a plane parallel to the main surface of the workpiece, and that emit reference light having a main emission wavelength in a range of 1.2 μm to 6.0 μm toward the main surface of the workpiece when power of the same power value is supplied to each of the reference light sources;
   a plurality of photodetectors that are arranged on a plane parallel to the main surface of the workpiece to correspond to the respective reference light sources, and that output signals in response to the intensity of the reference light that has been received; and
   a controller that executes a reference mode in which a plurality of values of the intensity of the reference light obtained by the signals output from the photodetectors are compared in order to determine power values of power that is to be supplied to each of the solid-state light sources, and a heating mode in which the power of the power values determined in the reference mode is supplied to each of the solid-state light sources,
   wherein the photodetectors are configured to receive the reference light that is emitted from the corresponding reference light sources and that is reflected on the main surface of the workpiece; and
   each of the reference light sources and the corresponding photodetectors is configured to allow a first optical path length of a main beam of the reference light to be substantially the same, the first optical path length being an optical path length of the reference light being output from each of the reference light sources and incident on the workpiece, and is configured to allow a second optical path length of the main beam of the reference light to be substantially the same, the second optical path length being an optical path length of the reference light being reflected on the main surface of the workpiece and incident on each of the photodetectors.

5. The optical heating device according to claim 4, wherein the controller is configured to turn off a plurality of the solid-state light sources when switched to the reference mode.

6. The optical heating device according to claim 4, wherein each of the reference light sources is arranged to have a separation distance to the corresponding photodetector longer than that of the other reference light sources to the corresponding photodetector.

7. An optical heating device comprising:
   a chamber that accommodates a workpiece as a heat treatment target;
   a supporter that supports the workpiece in the chamber;
   a plurality of heating light sources emitting heating light including infrared light having a wavelength in a range of 1.2 μm to 6.0 μm toward a main surface of the workpiece supported by the supporter;
   a plurality of photodetectors that are arranged to correspond to one of the heating light sources, and that output signals in response to the intensity of the infrared light that has been received; and a controller that executes a reference mode in which a plurality of values of the intensity of the heating light obtained by the signals output from the photodetectors are compared in order to determine power values of power that is to be supplied to each of the heating light sources, and a heating mode in which the power of the power values determined in the reference mode is supplied to each of the heating light sources, wherein the heating light sources and the corresponding photodetectors are arranged such that a light-emitting surface of the heating light sources and a light-receiving surface of the photodetectors face each other through the workpiece;

the photodetectors are configured to receive the heating light emitted from the corresponding heating light source and transmitted through the workpiece; and the controller supplies power of the same power value to at least the heating light sources that correspond to the photodetectors when switched to the reference mode.

8. The optical heating device according to claim 7, wherein the controller is configured to supply power of the same power value to a plurality of the heating light sources when switched to the reference mode.

9. The optical heating device according to claim 8, wherein the heating light sources are solid-state light sources.

10. The optical heating device according to claim 7, wherein the controller is configured to supply power of the same power value to the heating light sources that correspond to the photodetectors, and stop supplying power to the other heating light sources when switched to the reference mode.

11. The optical heating device according to claim 10, wherein the heating light sources are solid-state light sources.

12. The optical heating device according to claim 7, wherein the heating light sources are solid-state light sources.

* * * * *